United States Patent
Shin et al.

(10) Patent No.: US 11,609,258 B2
(45) Date of Patent: Mar. 21, 2023

(54) APPARATUS AND METHOD FOR DETECTING CABLE FAULT BASED ON REFLECTOMETRY USING AI

(71) Applicant: UIF (University Industry Foundation), Yonsei University, Seoul (KR)

(72) Inventors: Yong-June Shin, Seoul (KR); Gu-Young Kwon, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 0 days.

(21) Appl. No.: 17/371,776

(22) Filed: Jul. 9, 2021

(65) Prior Publication Data

US 2022/0170978 A1 Jun. 2, 2022

(30) Foreign Application Priority Data

Nov. 27, 2020 (KR) .................. 10-2020-0161961
May 12, 2021 (KR) .................. 10-2021-0061293

(51) Int. Cl.
  *G01R 31/11* (2006.01)
  *G06N 3/088* (2023.01)
  *G01R 31/00* (2006.01)
  *G01R 31/58* (2020.01)

(52) U.S. Cl.
  CPC ............ *G01R 31/11* (2013.01); *G01R 31/007* (2013.01); *G01R 31/58* (2020.01); *G06N 3/088* (2013.01)

(58) Field of Classification Search
  CPC ............ G01R 31/11; G01R 31/58–60; G01R 31/66–69; G01R 31/007; G06N 3/04
  See application file for complete search history.

(56) References Cited

U.S. PATENT DOCUMENTS

| | | | |
|---|---|---|---|
| 7,953,568 B2 | 5/2011 | Hays et al. | |
| 9,429,613 B1 * | 8/2016 | Borchert | G01R 31/58 |
| 2006/0097730 A1 * | 5/2006 | Park | G01R 31/11 |
| | | | 324/534 |
| 2015/0077131 A1 * | 3/2015 | Incarbone | G01R 31/58 |
| | | | 324/533 |

(Continued)

FOREIGN PATENT DOCUMENTS

| | | | | |
|---|---|---|---|---|
| DE | 102020118225 A1 * | 1/2021 | ......... | G05B 23/0218 |
| KR | 940015525 A | 7/1994 | | |

(Continued)

OTHER PUBLICATIONS

Marcello Mastroleo et al., "Automatic analysis of faulty low voltage network asset using deep neural networks," The 14th International Conference on Developments in Power System Protection (DPSP 2018), The Institution of Engineering and Technology, Sep. 2018.

*Primary Examiner* — Patrick Assouad
*Assistant Examiner* — Demetrius R Pretlow (57) ABSTRACT

According to an apparatus and a method for detecting a cable abnormality based on reflectometry utilizing artificial intelligence according to the exemplary embodiment of the present disclosure, it is possible to monitor a state of the cable which connects the nodes in real time by inserting a result of the time-frequency domain reflectometry into a variational autoencoder (VAE) which is one of unsupervised learning.

10 Claims, 8 Drawing Sheets

(56) References Cited

U.S. PATENT DOCUMENTS

| | | | | |
|---|---|---|---|---|
| 2019/0293706 A1* | 9/2019 | Sohn | ............... | G01R 31/08 |
| 2020/0116777 A1* | 4/2020 | Cabanillas | ............. | G01R 31/08 |
| 2020/0292608 A1* | 9/2020 | Yan | ............... | G06N 3/0445 |
| 2021/0350636 A1* | 11/2021 | Tang | ............... | G06N 3/088 |
| 2021/0353149 A1* | 11/2021 | Abbosh | ............ | G06K 9/6273 |

FOREIGN PATENT DOCUMENTS

| | | |
|---|---|---|
| KR | 20070118761 A | 12/2007 |
| KR | 10-2058230 B1 | 12/2019 |

\* cited by examiner

APPARATUS AND METHOD FOR DETECTING CABLE FAULT BASED ON REFLECTOMETRY USING AI

CROSS-REFERENCE TO RELATED APPLICATIONS

This application claims priority to and the benefit of Korean Patent Application No. 10-2020-0161961 filed in the Korean Intellectual Property Office on Nov. 27, 2020, Korean Patent Application No. 10-2021-0061293 filed in the Korean Intellectual Property Office on May 12, 2021, the entire contents of which are incorporated herein by reference.

TECHNICAL FIELD

The present disclosure relates to an apparatus and a method for detecting an abnormality of a cable based on reflectometry using artificial intelligence (AI), and more particularly, to an apparatus and a method for detecting an abnormality of a cable which connects nodes.

Specifically, the present disclosure relates to an apparatus and a method for detecting an abnormality of a cable which is applied to an autonomous vehicle which is driven by the self-determination without having driver's intervention to detect the abnormality of the cable which connects components in the autonomous vehicles to prevent accidents, in advance, which may be caused due to the malfunction of the autonomous vehicle.

This study is related to the project of "Diagnostics and Monitoring of Electric Power Systems for Super Grid (No 2020R1A2B5B03001692)" project conducted under the supervision of Yonsei University with funding from the Ministry of Science and ICT of 2020-2023 with the support of the National Research Foundation of Korea.

BACKGROUND ART

According to the related art, a monitoring parameter is extracted from a result of time-frequency domain reflectometry to observe the corresponding parameter to monitor the integrity of the cable. However, even though the cable operates under the normal condition, the reflected wave is likely to change. For example, an operating condition of a motor connected to an end terminal of the cable is changed, a temperature and a pressure of a superconducting cable is changed, or a connection topology of the cable is changed. According to the related art, such normal operations are highly likely to be determined as wiring abnormality. Further, according to the related art, a boundary value between the normal condition and an abnormal condition cannot be set so that even though the parameter is consistently changed, it is difficult to determine whether it is normal or abnormal.

SUMMARY OF THE INVENTION

An object to be achieved by the present disclosure is to provide an apparatus and a method for detecting a cable abnormality based on reflectometry utilizing artificial intelligence which monitors a state of the cable which connects the nodes in real time by inserting a result of the time-frequency domain reflectometry into a variational autoencoder (VAE) which is one of unsupervised learning.

Other and further objects of the present invention which are not specifically described can be further considered within the scope easily deduced from the following detailed description and the effect.

In order to achieve the above-mentioned object, according to an aspect of the present disclosure, a cable abnormality detecting apparatus based on reflectometry utilizing artificial intelligence is a cable abnormality detecting apparatus which detects an abnormality of a cable which connects nodes, including: a reflected signal acquiring unit which inputs a detection reference signal acquired based on a time-frequency domain reflectometry into the cable and acquires a reflected signal which is reflected to return; and an abnormality detecting unit which inputs the reflected signal acquired by the reflected signal acquiring unit to a variational autoencoder (VAE) based cable abnormality detection network model, acquires an outlier score for the cable by means of the cable abnormality detection network model, and detects an abnormality of the cable by comparing the acquired outlier score and a predetermined threshold value.

Here, the node is a component located in an autonomous vehicle and the cable abnormality detecting apparatus is mounted in the autonomous vehicle to detect the abnormality of the cable in the unit of predetermined time.

Here, the cable abnormality detection network model includes: a data windowing layer which windows a reflected signal configured by time-series data with a magnitude of a time duration to preprocess the reflected signal to frame-unit data; a normalization layer which normalizes the reflected signal preprocessed to frame unit data by the data windowing layer; an encoder layer which is formed of a combination of a long short-term memory (LSTM) and a fully connected neural network (FCNN) and has the reflected signal which is normalized by the normalization layer as an input and outputs a latent space; a decoder layer which is formed of a combination of the long short-term memory (LSTM) and the fully connected neural network (FCNN) and has the latent space output by means of the encode layer as an input; and a scoring layer which has data output through the decoder layer as an input and outputs an outlier score for the score.

Here, the normalization layer includes a fully connected neural network (FCNN) which receives a reflected signal preprocessed to the frame unit data and outputs a target voltage value which is a ratio of the detection reference signal included in the frame in the frame unit.

Here, the scoring layer acquires the outlier score for the cable based on a reconstruction probability of data output through the decoder layer and outputs the acquired outlier score.

Here, the scoring layer acquires a score for a target frame based on the universal set of log reconstruction probabilities in the normal condition and a log reconstruction probability of a target frame and performs min-max normalization on the acquired score using the universal set of the log reconstruction probabilities in the normal condition to acquire an outlier score for the target frame.

Here, the abnormality detecting unit detects a position of the cable in which the abnormality is found and a level of abnormality by comparing the outlier score and the threshold value.

Here, the cable abnormality detecting apparatus may further include a detection reference signal generating which generates the detection reference signal based on a physical characteristic and an electrical characteristic of the cable.

In order to achieve the above-mentioned object, according to another aspect of the present disclosure, a cable abnormality detecting method based on reflectometry utilizing artificial intelligence is a cable abnormality detecting method which is performed in a cable abnormality detecting apparatus which detects an abnormality of a cable which connects nodes, including: inputting a detection reference signal acquired based on a time-frequency domain reflectometry into the cable and acquiring a reflected signal which is reflected to return; inputting the reflected signal to a variational autoencoder (VAE) based cable abnormality detection network model; acquiring an outlier score for the cable by means of the cable abnormality detection network model; and detecting an abnormality of the cable by comparing the acquired outlier score and a predetermined threshold value.

Here, the node is a component located in an autonomous vehicle and the cable abnormality detecting apparatus is mounted in the autonomous vehicle to detect the abnormality of the cable by performing the cable abnormality detecting method in the unit of predetermined time.

Here, the cable abnormality detection network model includes: a data windowing layer which windows a reflected signal configured by time-series data with a magnitude of a time duration to preprocess the reflected signal to frame-unit data; a normalization layer which normalizes the reflected signal preprocessed to frame unit data by the data windowing layer; an encoder layer which is formed of a combination of a long short-term memory (LSTM) and a fully connected neural network (FCNN) and has the reflected signal which is normalized by the normalization layer as an input and outputs a latent space; a decoder layer which is formed of a combination of the long short-term memory (LSTM) and the fully connected neural network (FCNN) and has the latent space output by means of the encode layer as an input; and a scoring layer which has data output through the decoder layer as an input and outputs an outlier score for the score.

In order to achieve the aforementioned technical object, a computer program according to the exemplary embodiment of the present disclosure is stored in a computer-readable recording medium to execute any one of the cable abnormality detecting methods based on the reflectometry utilizing the artificial intelligence on a computer.

According to the apparatus and the method for detecting a cable abnormality based on reflectometry utilizing artificial intelligence according to the exemplary embodiment of the present disclosure, it is possible to monitor a state of the cable which connects the nodes in real time by inserting a result of the time-frequency domain reflectometry into a variational autoencoder (VAE) which is one of unsupervised learning.

Further, in a variational autoencoder (VAE) based outlier detection algorithm, all types of time-frequency domain reflectometry result which are determined to be normal are used to train a network, so that all cases excluding the result used for the training may be determined as wiring abnormality.

Further, a maximum value of the outlier score which may be obtained in the normal condition is normalized to 1 so that it is possible to distinguish normality and abnormality of the wiring line based on an exact boundary value.

The effects of the present invention are not limited to the technical effects mentioned above, and other effects which are not mentioned can be clearly understood by those skilled in the art from the following description

BRIEF DESCRIPTION OF DRAWINGS

FIGS. 5A, 5B, and 5C are views for explaining a performance of a cable abnormality detecting operation according to an exemplary embodiment of the present disclosure in which

DETAILED DESCRIPTION OF THE EMBODIMENT

Hereinafter, embodiments of the present disclosure will be described in detail with reference to the accompanying drawings. Advantages and characteristics of the present invention and a method of achieving the advantages and characteristics will be clear by referring to exemplary embodiments described below in detail together with the accompanying drawings. However, the present invention is not limited to exemplary embodiments disclosed herein but will be implemented in various different forms. The exemplary embodiments are provided by way of example only so that a person of ordinary skilled in the art can fully understand the disclosures of the present invention and the scope of the present invention. Therefore, the present invention will be defined only by the scope of the appended claims. Like reference numerals indicate like elements throughout the specification.

Unless otherwise defined, all terms (including technical and scientific terms) used in the present specification may be used as the meaning which may be commonly understood by the person with ordinary skill in the art, to which the present invention belongs. It will be further understood that terms defined in commonly used dictionaries should not be interpreted in an idealized or excessive sense unless expressly and specifically defined.

In the specification, the terms "first" or "second" are used to distinguish one component from the other component so that the scope should not be limited by these terms. For example, a first component may be referred to as a second component, and similarly, a second component may be referred to as a first component.

In the present specification, in each step, numerical symbols (for example, a, b, and c) are used for the convenience of description, but do not explain the order of the steps so that unless the context apparently indicates a specific order, the order may be different from the order described in the specification. That is, the steps may be performed in the order as described or simultaneously, or an opposite order.

In this specification, the terms "have", "may have", "include", or "may include" represent the presence of the characteristic (for example, a numerical value, a function, an operation, or a component such as a part"), but do not exclude the presence of additional characteristic.

The term "~-unit" used in the specification refers to a software or hardware component such as a field programmable gate array (FPGA) or an ASIC and "~-unit" performs some functions. However, "~-unit" is not limited to the software or the hardware. "~-unit" may be configured to be in an addressable storage medium or may be configured to reproduce one or more processors. Accordingly, as an example, "~unit" includes components such as software components, object oriented software components, class components, and task components, processes, functions, attributes, procedures, subroutines, segments of a program code, drivers, a firmware, a microcode, a circuit, data structures, and variables. A function which is provided in the components and "~units" may be combined with a smaller number of components and "~units" or further divided into additional components and "~units".

Hereinafter, exemplary embodiments of an apparatus and a method for detecting a cable abnormality based on reflectometry utilizing artificial intelligence according to the present disclosure will be described in detail with reference to the accompanying drawings.

First, a cable abnormality detecting apparatus based on reflectometry utilizing artificial intelligence according to an exemplary embodiment of the present disclosure will be described with reference to FIGS. 1 to 5.

Figure 1:
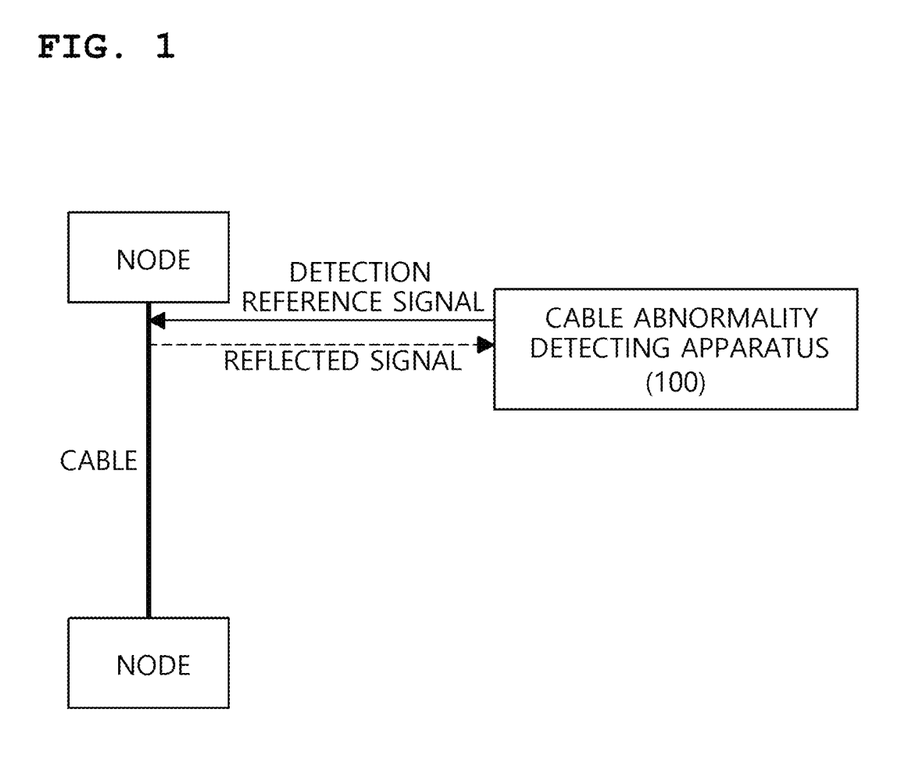
FIG. 1 is a block diagram for explaining a cable abnormality detecting apparatus based on reflectometry utilizing artificial intelligence according to an exemplary embodiment of the present disclosure.
Figure 2:
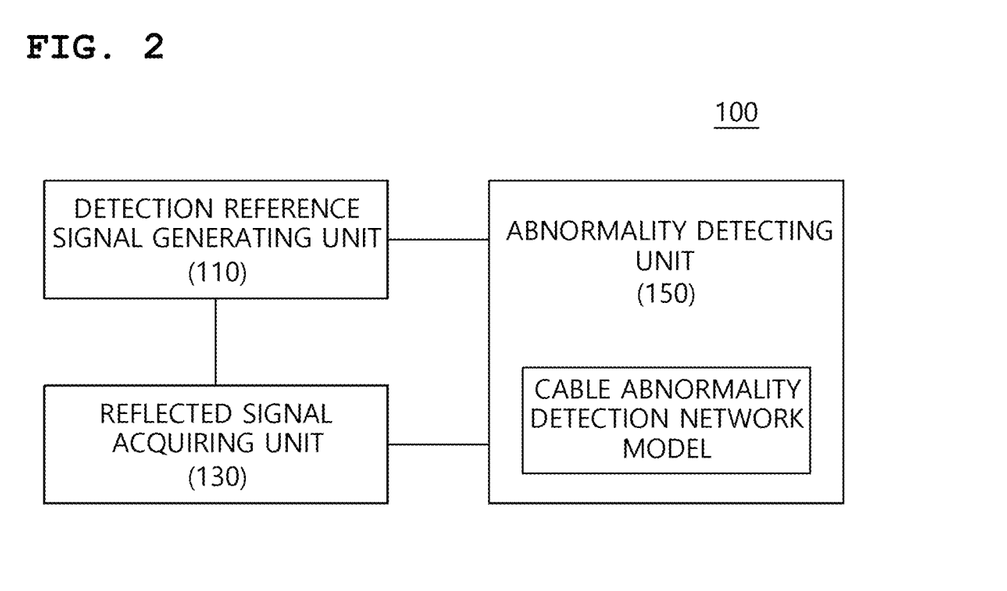
FIG. 2 is a block diagram for explaining a detailed configuration of a cable abnormality detecting apparatus illustrated in FIG. 1.
Figure 3:
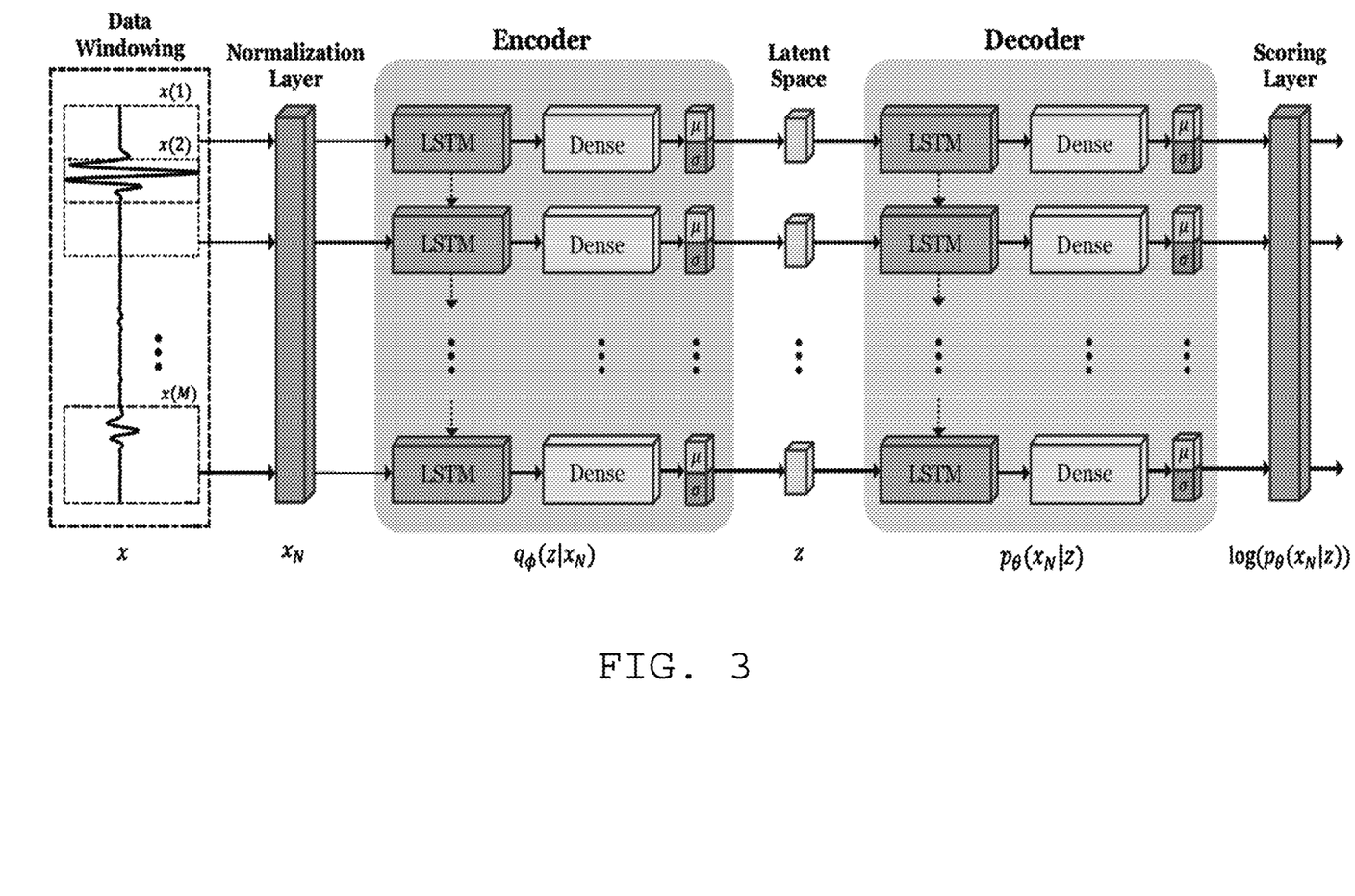
FIG. 3 is a view for explaining a cable abnormality detecting network according to an exemplary embodiment of the present disclosure.
Figure 4:
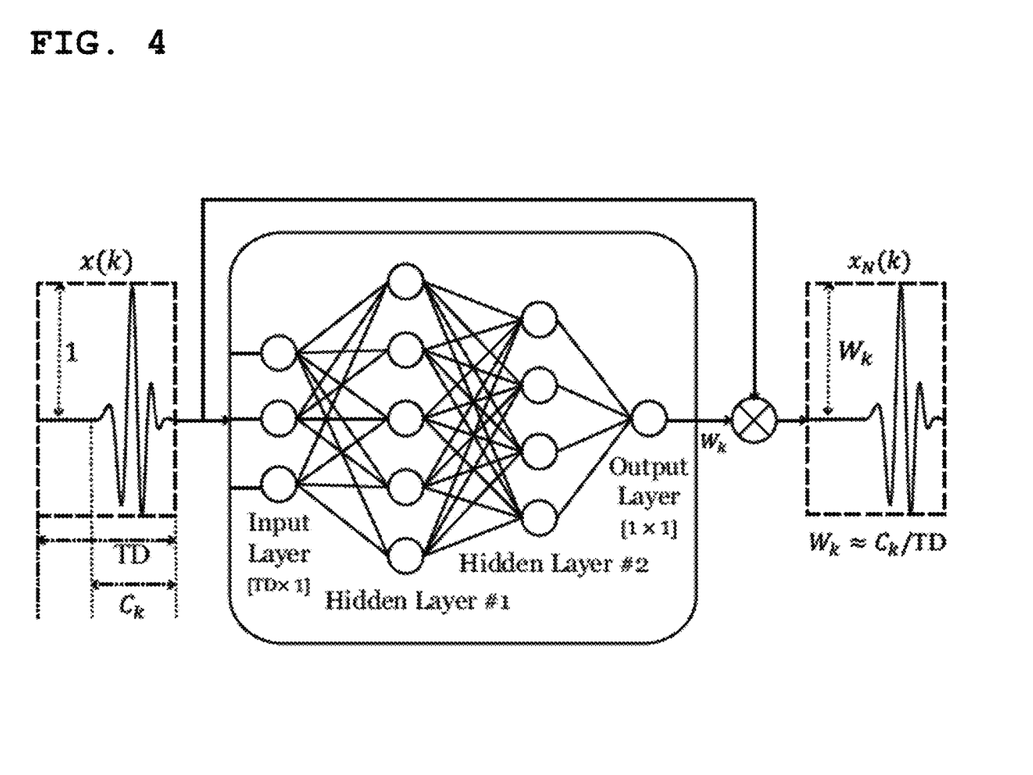
FIG. 4 is a view for explaining a detailed structure of a normalization layer illustrated in FIG. 3.
Figure 5A:
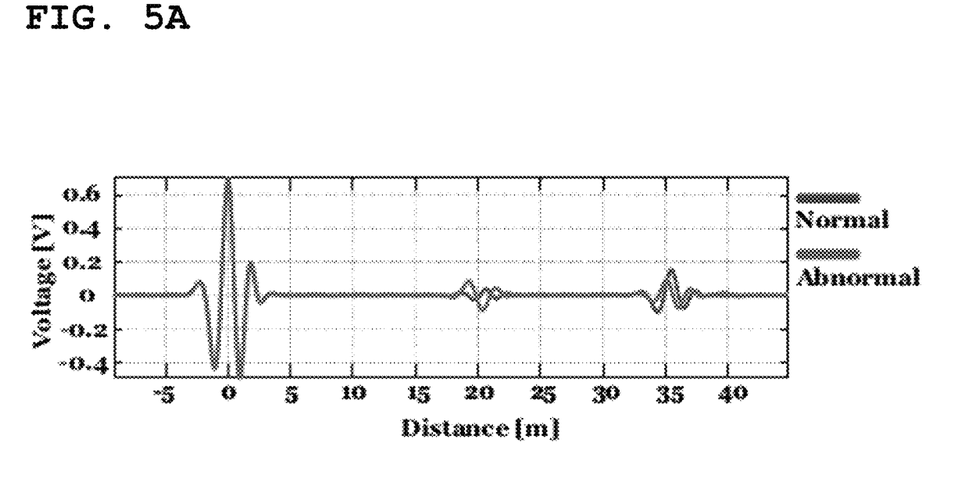
FIG. 5A illustrates a reflected signal.
Figure 5B:
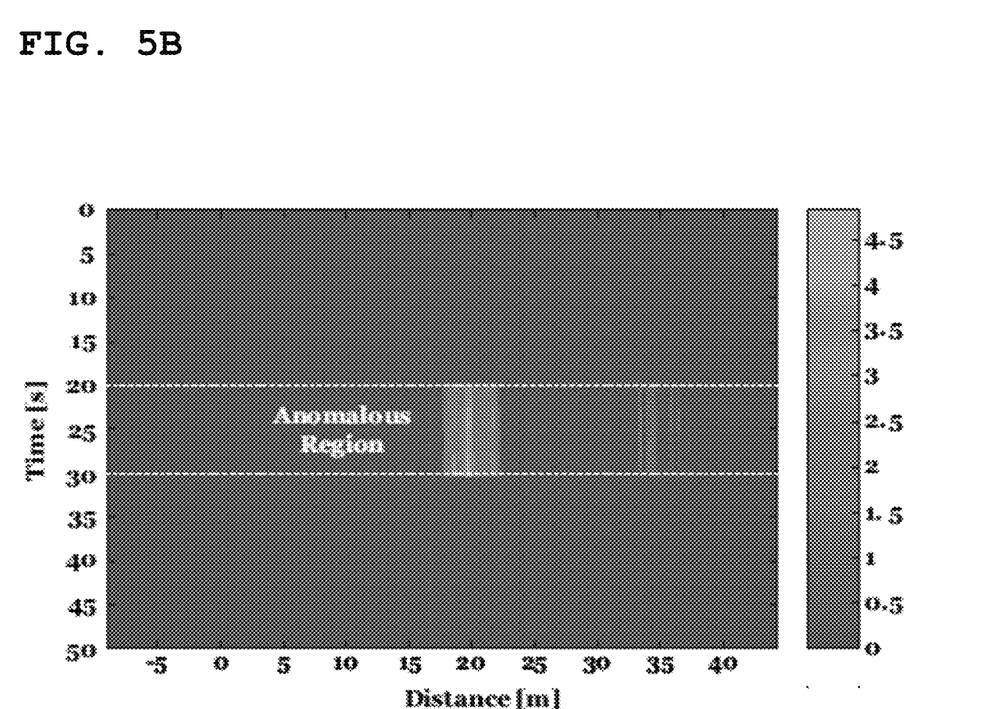
FIG. 5B illustrates an outlier score according to the present disclosure.
Figure 5C:
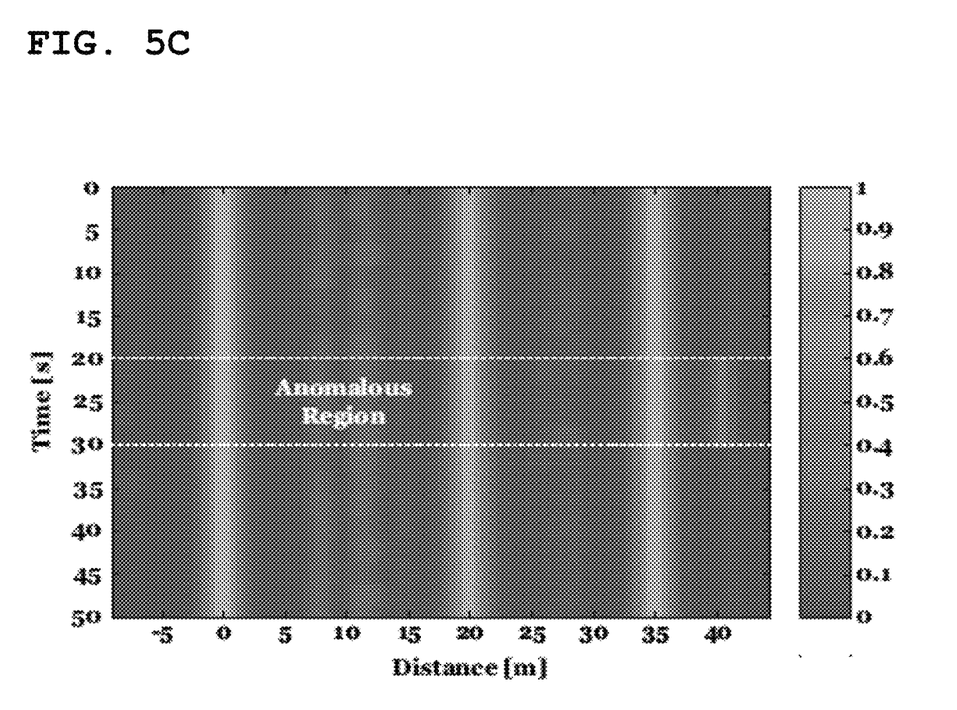
FIG. 5C illustrates a time-frequency cross correlation function of the related art.

FIG. 1 is a block diagram for explaining a cable abnormality detecting apparatus based on reflectometry utilizing artificial intelligence according to an exemplary embodiment of the present disclosure, FIG. 2 is a block diagram for explaining a detailed configuration of a cable abnormality detecting apparatus illustrated in FIG. 1, FIG. 3 is a view for explaining a cable abnormality detecting network according to an exemplary embodiment of the present disclosure, FIG. 4 is a view for explaining a detailed structure of a normalization layer illustrated in FIG. 3, and FIGS. 5A, 5B, and 5C are views for explaining a performance of a cable abnormality detecting operation according to an exemplary embodiment of the present disclosure in which FIG. 5A illustrates a reflected signal, FIG. 5B illustrates an outlier score according to the present disclosure, and FIG. 5C illustrates a time-frequency cross correlation function of the related art.

Referring to FIG. 1, a cable abnormality detecting apparatus 100 based on reflectometry utilizing artificial intelligence according to an exemplary embodiment of the present disclosure (hereinafter, simply referred to as "cable abnormality detecting apparatus") detects abnormality of a cable which connects nodes.

Here, the nodes may be components located in the autonomous vehicle (not illustrated).

The cable abnormality detecting apparatus 100 is mounted in the autonomous vehicle to detect abnormality of the cable at the predetermined time unit.

That is, the cable abnormality detecting apparatus 100 inserts a result of a time-frequency domain reflectometry into a variational auto encoder (VAE) which is one of unsupervised learning to monitor a condition of a cable which connects the nodes, in real time.

To this end, referring to FIG. 2, the cable abnormality detecting apparatus 100 includes a detection reference signal generating unit 110, a reflected signal acquiring unit 130, and an abnormality detecting unit 150.

The detection reference signal generating unit 110 may generate a detection reference signal based on a physical characteristic and an electrical characteristic of the cable.

Here, the detection reference signal may be acquired based on the time-frequency domain reflectometry.

The reflection signal acquiring unit 130 inserts the detection reference signal generated by the detection reference signal generating unit 110 into the cable and acquires a reflected signal which is reflected to return.

The abnormality detecting unit 150 detects the abnormality of the cable based on the reflected signal acquired from the reflected signal acquiring unit 130 by utilizing artificial intelligence.

That is, the abnormality detecting unit 150 inputs a reflected signal acquired by the reflected signal acquiring unit 130 into a cable abnormality detection network model based on variational autoencoder (VAE), acquires an outlier score for the cable by the cable abnormality detection network model, and detects the abnormality of the cable by comparing the acquired outlier score and a predetermined threshold value (for example, the threshold value is normalized to 1). For example, when the outlier score exceeds the threshold "1", the abnormality detecting unit 150 determines that the cable is abnormal.

At this time, the abnormality detecting unit 150 compares the outlier score and the threshold value to detect a position of the cable where the abnormality is found and a level of abnormality.

Here, the cable abnormality detection network model, as illustrated in FIG. 3, includes a data windowing layer, a normalization layer, an encoder layer, a decoder layer, and a scoring layer.

The data windowing layer may window a reflected signal configured by time-series data with a magnitude of a predetermined time duration to preprocess the reflected signal to frame-unit data. Here, the windowing is performed to simultaneously detect an outlier of a cable by inputting data in the frame unit and estimate an abnormal position.

The normalization layer may normalize the reflected signal which is preprocessed to the frame unit data by means of the data windowing layer.

That is, as illustrated in FIG. 4, the normalization layer may include a fully connected neural network (FCNN) which receives a reflected signal preprocessed to the frame unit data and outputs a target voltage value $W_k$ which is a ratio of the detection reference signal included in the frame in the frame unit.

For example, when the detection reference signal is fully included in the frame, the target voltage is "1" and when only half the detection reference signal is included in the frame, the target voltage value is "0.5", and when there is no detection reference signal, the target voltage value may be "0".

A training target ($\hat{W}_k$) of the fully connected neural network (FCNN) used during the training process of the normalization layer is determined by the following equation.

$$\hat{W}_k = C_k / TD$$

Here, $C_k$ indicates a time when the detection reference signal is included in a k-th frame. TD indicates a time duration of the detection reference signal.

Since the reflected signal which is a result of the time-frequency domain reflectometry corresponds to time-series data, the encoder layer is configured by a combination of a long short-term memory (LSTM) and the fully connected neural network (FCNN) and has the reflected signal which is normalized by the normalization layer as an input and outputs a latent space.

Since the reflected signal which is a result of the time-frequency domain reflectometry corresponds to time-series data, the decoder layer is configured by a combination of a long short-term memory (LSTM) and the fully connected neural network (FCNN) and has the latent space output through the encoder layer as an input.

The scoring layer has data output through the decoder layer as an input and outputs an outlier score for the cable.

That is, the scoring layer acquires the outlier score for the cable based on a reconstruction probability of data output through the decoder layer and outputs the acquired outlier score.

To be more specific, the scoring layer acquires a score for a target frame based on the universal set of log reconstruction probabilities in the normal condition and a log reconstruction probability of a target frame and performs min-max normalization on the acquired score using the universal set of the log reconstruction probabilities in the normal condition to acquire an outlier score for the target frame.

For example, the outlier score S(k) is calculated based on the reconstruction probability of data output from the decoder layer. The outlier score is calculated by the following equation.

$$S(k) = \max(R_n) - R(k)/\max(R_n) - \min(R_n)'$$

$$R(k) = \log(P_e((k)|z(k)))$$

Here, $R_n$ indicates the universal set of the log reconstruction probabilities in the normal condition. R(k) indicates a log reconstruction probability of a k-th frame. By means of the min-max normalization, a maximum outlier score is 1 in the normal cable condition and the outlier score is increased to 1 or larger in the abnormal condition.

A result illustrated in FIGS. 5A, 5B, and 5C is a result obtained by applying the present disclosure to a total 35 m of a normal cable obtained by connecting 20 m of cable and 15 m of cable. At the moment of 20 seconds after starting the experiment, a resistor was connected to 20 m of joint point to cause the failure and the failure was maintained for 10 seconds. The time-frequency cross correlation function used for determination of the failure according to the related art does not detect the corresponding change, as illustrated in FIG. 5C. However, as illustrated in FIG. 5B, it is confirmed that the outlier score proposed by the present disclosure is sharply increased to 1 or larger as soon as the resistor is attached so that the failure may be observed in real time.

Now, a cable abnormality detecting method based on reflectometry utilizing artificial intelligence according to an exemplary embodiment of the present disclosure will be described with reference to FIG. 6.

Figure 6:
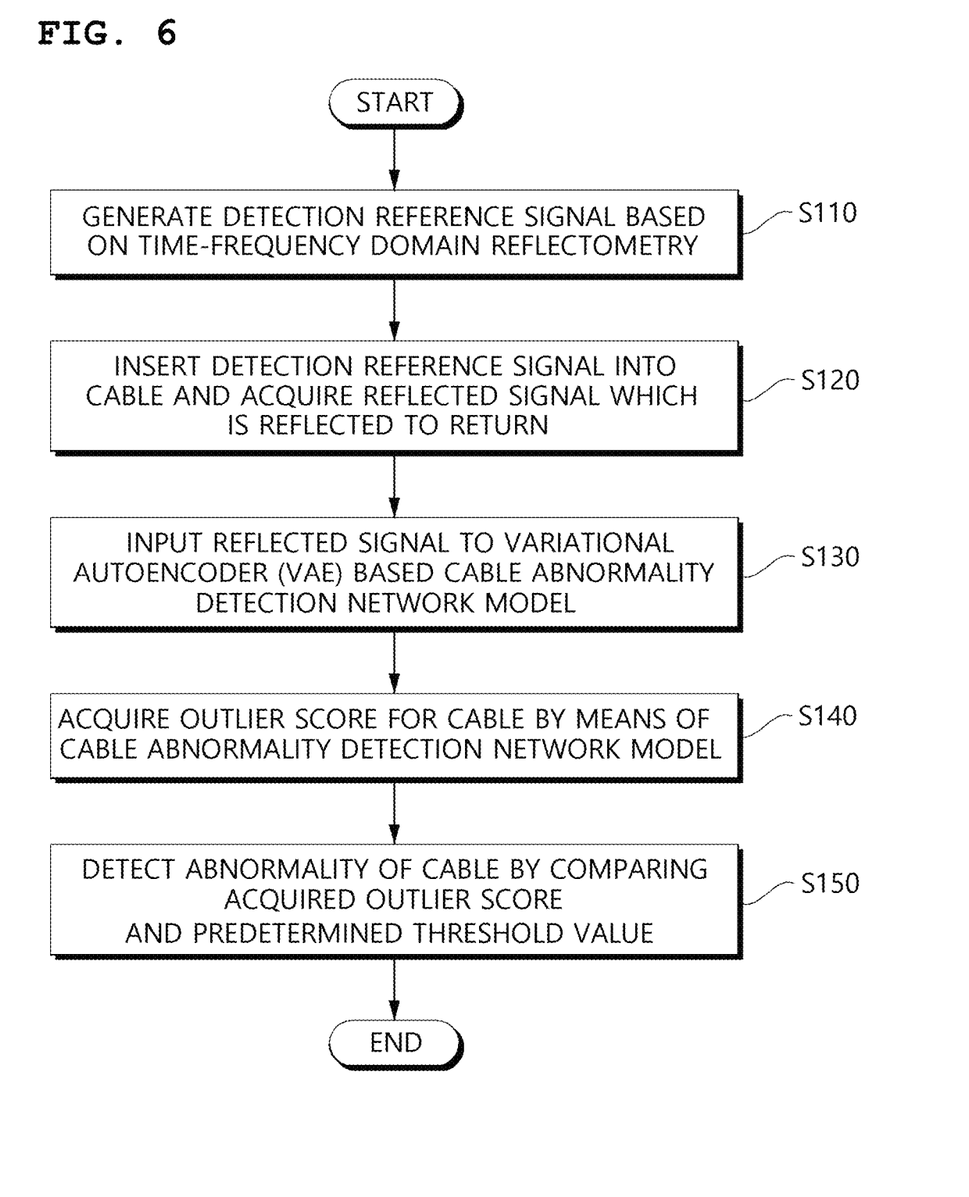
FIG. 6 is a flowchart for explaining a cable abnormality detecting method based on reflectometry utilizing artificial intelligence according to an exemplary embodiment of the present disclosure.

FIG. 6 is a flowchart for explaining a cable abnormality detecting method based on reflectometry utilizing artificial intelligence according to an exemplary embodiment of the present disclosure.

Referring to FIG. 6, the cable abnormality detecting apparatus 100 generates a detection reference signal based on time-frequency domain reflectometry in step S110.

At this time, the cable abnormality detecting apparatus 100 may generate a detection reference signal based on a physical characteristic and an electrical characteristic of the cable.

Next, the cable abnormality detecting apparatus 100 inputs a detection reference signal into a cable and acquires a reflected signal which is reflected to return in step S120.

By doing this, the cable abnormality detecting apparatus 100 inputs the reflected signal in a cable abnormality detection network model based on a variational autoencoder (VAE) in step S130.

Here, the cable abnormality detection network model includes a data windowing layer, a normalization layer, an encoder layer, a decoder layer, and a scoring layer.

Next, the cable abnormality detecting apparatus 100 acquires an outlier score for the cable by means of the cable abnormality detection network model in step S140.

Next, the cable abnormality detecting apparatus 100 detects the abnormality of the cable by comparing the acquired outlier score and a predetermined threshold value (for example, the threshold value is normalized to 1).

At this time, the cable abnormality detecting apparatus 100 compares the outlier score and the threshold value to detect a position of the cable where the abnormality is found and a level of abnormality.

Marketability and Expected Effect of the Present Disclosure

As the complexity of the electric system is increased, the demand related to the stability of the facility is gradually increasing. The cables are in charge of functions such as control, measurement, communication, and power supply by means of connection between facilities and the wiring failure may lead to fire, human damage, and economic loss due to abnormal operations of the facilities.

The present disclosure is a technique of diagnosing the wiring line in real time to quickly detect an abnormal operation and position and is applicable to all facilities including wiring lines. In a power system, the present disclosure is used for the transmission, control, and measurement cables and in an industrial system, the present disclosure is used to monitor the wiring lines of an electric vehicle or an automatic robot which are rapidly developing, in real time. An applicable range of the present disclosure is very wide so that it is determined that the marketability and expected effects are very high.

Even though it has been described above that all components of the exemplary embodiment of the present invention are combined as one component or operate to be combined, the present invention is not limited to the exemplary embodiment. In other words, one or more components may be selectively combined to be operated within a scope of the present invention. Further, all components may be implemented as one independent hardware but a part or all of the components are selectively combined to be implemented as a computer program which includes a program module which performs a part or all functions combined in one or plural hardware. Further, such a computer program may be stored in a computer readable media such as a USB memory, a CD disk, or a flash memory to be read and executed by a computer to implement the exemplary embodiment of the present invention. The recording media of the computer program may include a magnetic recording medium or an optical recording medium.

The above description illustrates a technical spirit of the present invention as an example and various changes, modifications, and substitutions become apparent to those skilled in the art within a scope of an essential characteristic of the present invention. Therefore, as is evident from the foregoing description, the exemplary embodiments and accompanying drawings disclosed in the present invention do not limit the technical spirit of the present invention and the scope of the technical spirit of the present invention is not limited by the exemplary embodiments and accompanying drawings. The protection scope of the present invention should be interpreted based on the following appended claims and it should be appreciated that all technical spirits included within a range equivalent thereto are included in the protection scope of the present invention.

What is claimed is:

1. A cable abnormality detecting apparatus based on reflectometry utilizing artificial intelligence which detects an abnormality of a cable which connects nodes, the cable abnormality detecting apparatus comprising:
- a trained cable abnormality detection network model based on a variational autoencoder (VAE) and stored in one or more non-transitory computer readable storage media;
- one or more processors configured to:
  - generate a detection reference signal based on a time-frequency domain reflectometry;
  - insert the detection reference signal into the cable;
  - receive a reflected signal of the detection reference signal from the cable;
  - apply the reflected signal to the trained cable abnormality detection network model;
  - generate, over the trained cable abnormality detection network model, an outlier score for the cable; and
  - detect an abnormality of the cable by comparing the outlier score and a predetermined threshold value,
- wherein the trained cable abnormality detection network model includes:
  - a data windowing layer which windows the reflected signal configured by time-series data with a magnitude of a predetermined time duration to preprocess the reflected signal to frame unit data;
  - a normalization layer which normalizes the reflected signal preprocessed to the frame unit data by the data windowing layer;
  - an encoder layer which is formed of a combination of a long short-term memory (LSTM) and a fully connected neural network (FCNN) and has the reflected signal which is normalized by the normalization layer as an input and outputs a latent space;
  - a decoder layer which is formed of a combination of the long short-term memory (LSTM) and the fully connected neural network (FCNN) and has the latent space output by means of the encoder layer as an input; and
  - a scoring layer which has data output through the decoder layer as an input and outputs the outlier score for the cable.

2. The cable abnormality detecting apparatus according to claim 1, wherein the node is a component located in an autonomous vehicle and the cable abnormality detecting apparatus is mounted in the autonomous vehicle to detect the abnormality of the cable at a predetermined time unit.

3. The cable abnormality detecting apparatus according to claim 1, wherein the normalization layer includes a fully connected neural network (FCNN) which receives the reflected signal preprocessed to the frame unit data and outputs a target voltage value which is a ratio of the detection reference signal included in a frame in a frame unit.

4. The cable abnormality detecting apparatus according to claim 1, wherein the scoring layer acquires the outlier score for the cable based on a reconstruction probability of data output through the decoder layer and outputs the acquired outlier score.

5. The cable abnormality detecting apparatus according to claim 4, wherein the scoring layer acquires a score for a target frame based on a universal set of log reconstruction probabilities in the normal condition and a log reconstruction probability of a target frame and performs min-max normalization on the acquired score using the universal set of the log reconstruction probabilities in the normal condition to acquire an outlier score for the target frame.

6. The cable abnormality detecting apparatus according to claim 2, wherein the one or more processors are configured to detect a position of the cable in which the abnormality is found and a level of abnormality by comparing the outlier score and the predetermined threshold value.

7. The cable abnormality detecting apparatus according to claim 2, wherein the one or more processors are configured to generate
the detection reference signal based on a physical characteristic and an electrical characteristic of the cable.

8. A cable abnormality detecting method based on reflectometry utilizing artificial intelligence which is performed in a cable abnormality detecting apparatus which detects an abnormality of a cable which connects nodes, the cable abnormality detecting method comprising:
- generate, by one or more processors, a detection reference signal based on a time-frequency domain reflectometry;
- insert, by the one or more processors, the detection reference signal into the cable;
- receive, by the one or more processors, a reflected signal of the detection reference signal from the cable;
- apply, by the one or more processors, the reflected signal to a trained cable abnormality detection network model;
- generate, by the one or more processors, over the trained cable abnormality detection network model, an outlier score for the cable; and
- detect, by the one or more processors, an abnormality of the cable by comparing the outlier score and a predetermined threshold value,
- wherein the trained cable abnormality detection network model includes:
  - a data windowing layer which windows the reflected signal configured by time-series data with a magnitude of a time duration to preprocess the reflected signal to frame unit data;
  - a normalization layer which normalizes the reflected signal preprocessed to the frame unit data by the data windowing layer;
  - an encoder layer which is formed of a combination of a long short-term memory (LSTM) and a fully connected neural network (FCNN) and has the reflected signal which is normalized by the normalization layer as an input and outputs a latent space;
  - a decoder layer which is formed of a combination of the long short-term memory (LSTM) and the fully connected neural network (FCNN) and has the latent space output by means of the encoder layer as an input; and
  - a scoring layer which has data output through the decoder layer as an input and outputs the outlier score for the cable.

9. The cable abnormality detecting method according to claim 8, wherein the node is a component located in an autonomous vehicle and the cable abnormality detecting apparatus is mounted in the autonomous vehicle to detect the abnormality of the cable by performing the cable abnormality detecting method at a predetermined time unit.

10. A non-transitory computer readable storage medium comprising a computer program to execute the cable abnormality detecting method based on reflectometry utilizing artificial intelligence according to claim 8.

* * * * *